United States Patent
Siegel et al.

(10) Patent No.: US 7,456,050 B2
(45) Date of Patent: Nov. 25, 2008

(54) SYSTEM AND METHOD FOR CONTROLLING INTEGRATED CIRCUIT DIE HEIGHT AND PLANARITY

(75) Inventors: Harry Michael Siegel, Hurst, TX (US); Robert Henry Bond, Plano, TX (US); Tom Quoc Lao, Murphy, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/611,153

(22) Filed: Jul. 1, 2003

(65) Prior Publication Data

US 2005/0001330 A1   Jan. 6, 2005

(51) Int. Cl.
   *H01L 21/00* (2006.01)
(52) U.S. Cl. .................. 438/118; 257/E21.514
(58) Field of Classification Search .................. 438/117, 438/118, 127, FOR. 371, FOR. 369, FOR. 372; 257/782, 784, 726, 727, 778, E21.503
See application file for complete search history.

(56) References Cited

U.S. PATENT DOCUMENTS

| | | | | |
|---|---|---|---|---|
| 5,642,265 A * | 6/1997 | Bond et al. | .................. | 361/809 |
| 5,756,380 A * | 5/1998 | Berg et al. | .................. | 438/126 |
| 6,208,020 B1 * | 3/2001 | Minamio et al. | ............ | 257/684 |
| 6,274,823 B1 * | 8/2001 | Khandros et al. | ............ | 174/261 |
| 6,338,984 B2 * | 1/2002 | Minamio et al. | ............ | 438/123 |
| 6,355,507 B1 * | 3/2002 | Fanworth | .................. | 438/127 |
| 6,396,292 B2 * | 5/2002 | Hembree et al. | ............ | 324/755 |
| 6,472,758 B1 * | 10/2002 | Glenn et al. | ................. | 257/777 |
| 6,507,104 B2 * | 1/2003 | Ho et al. | ..................... | 257/712 |
| 6,580,167 B1 * | 6/2003 | Glenn et al. | ................. | 257/718 |
| 6,686,227 B2 * | 2/2004 | Zhou et al. | ................... | 438/127 |
| 6,815,262 B2 * | 11/2004 | Hundt et al. | ................. | 438/127 |
| 6,853,089 B2 * | 2/2005 | Ujiie et al. | .................... | 257/783 |
| 6,919,420 B2 * | 7/2005 | Buchwalter et al. | ......... | 528/230 |
| 6,987,032 B1 * | 1/2006 | Fan et al. | ..................... | 438/122 |
| 2002/0029857 A1 * | 3/2002 | Yamada | ..................... | 156/556 |
| 2003/0099097 A1 * | 5/2003 | Mok et al. | ................... | 361/767 |
| 2003/0140678 A1 * | 7/2003 | Siegel et al. | .................. | 72/456 |
| 2003/0143406 A1 * | 7/2003 | Siegel et al. | ................ | 428/447 |
| 2004/0135266 A1 * | 7/2004 | Koh | ............................ | 257/782 |
| 2004/0241905 A1 * | 12/2004 | Hundt et al. | ................ | 438/106 |

FOREIGN PATENT DOCUMENTS

JP    01-199440    *   8/1989

OTHER PUBLICATIONS

"Manufacture Of Semiconductor Device", Patent Abstracts of Japan, Tomohiko et al., Publication No. 01-199440 (Aug. 10, 1989).*

* cited by examiner

*Primary Examiner*—W. David Coleman
*Assistant Examiner*—Khiem D Nguyen
(74) *Attorney, Agent, or Firm*—Lisa K. Jorgenson; William A. Munck

(57) ABSTRACT

A system and method is disclosed for controlling a height and a planarity of an integrated circuit die. In one advantageous embodiment of the invention, a plurality of patterned metal stops are fabricated on an integrated circuit substrate and covered with die attach material. An integrated circuit die is inserted into the die attach material and placed into a clamping mechanism of a molding machine. The clamping mechanism (1) compresses the die into the die attach material, (2) rotates the die into parallel alignment with the substrate, and (3) pushes the die into contact with the patterned metal stops. In this manner the die height and the die planarity are precisely controlled.

6 Claims, 13 Drawing Sheets

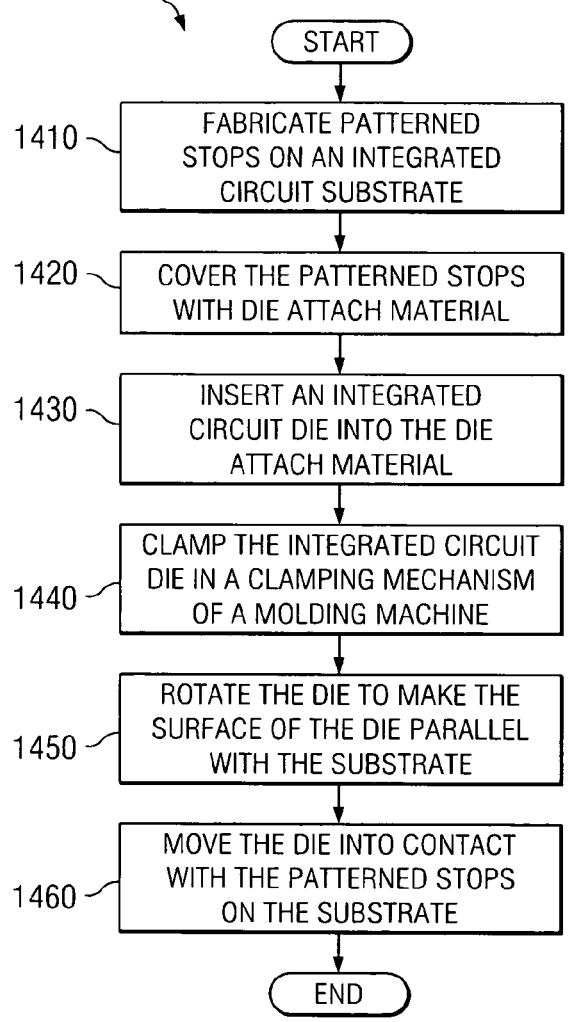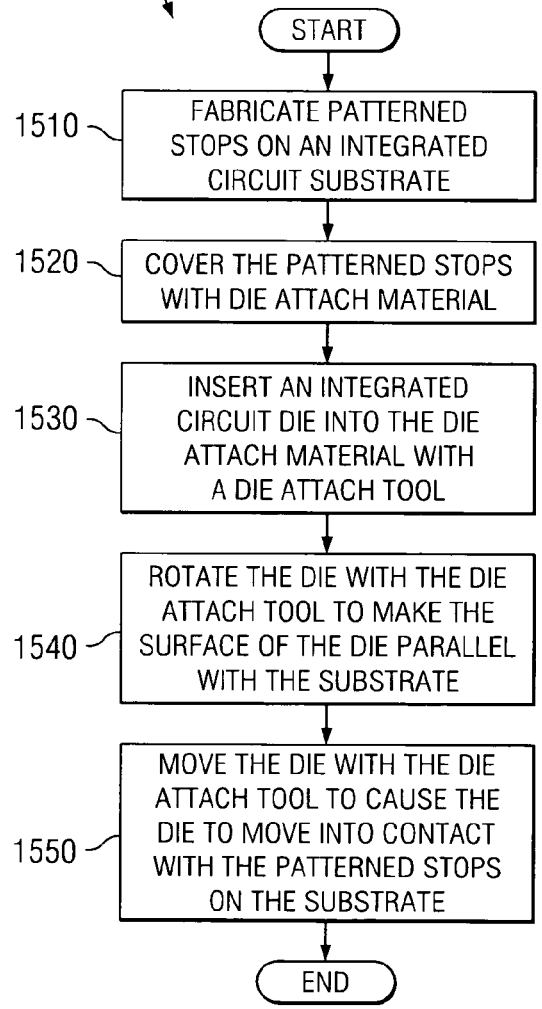

SYSTEM AND METHOD FOR CONTROLLING INTEGRATED CIRCUIT DIE HEIGHT AND PLANARITY

TECHNICAL FIELD OF THE INVENTION

The present invention is directed, in general, to integrated circuits and, more specifically, to a system and method for controlling the height and planarity of an integrated circuit die in a molding machine.

BACKGROUND OF THE INVENTION

An integrated circuit package generally comprises a substrate made of epoxy impregnated fiberglass material, an integrated circuit made of silicon, and an encasing material that surrounds delicate electrical elements to protect them from mechanical damage and environmental exposure. During the manufacture of an integrated circuit package, the integrated circuit portion is generally referred to as an integrated circuit die.

There are certain manufacturing processes for an integrated circuit package (e.g., transfer molding of an exposed integrated circuit die) that require the integrated circuit die to be clamped. In these types of processes it is highly desirable that the integrated circuit die be located accurately in three dimensions. It is also highly desirable that the accurate three dimensional location of the integrated circuit die be repeatable.

The alignment of an integrated circuit die on a substrate is normally considered to be acceptable if the integrated circuit die is placed in its intended position within a tolerance of approximately one hundred microns (100 µm).

The placement of an integrated circuit die on the surface of the substrate may be considered as a problem of aligning the integrated circuit die within a conventional three dimensional rectangular coordinate system comprising an X-axis, a Y-axis and a Z-axis. The X-axis and the Y-axis form a plane that is coincident with the surface of the substrate. The Z-axis is perpendicular to the plane formed by the X-axis and the Y-axis. The value of Z represents the vertical location of the integrated circuit die with respect to the plane surface of the substrate.

To be within the normally acceptable tolerance of one hundred microns (100 µm), the location of the integrated circuit die on the substrate with respect to the X-axis must be within plus or minus one hundred microns (100 µm) of the intended X position. Similarly, the location of the integrated circuit die on the substrate with respect to the Y-axis must be within plus or minus one hundred microns (100 µm) of the intended Y position. Lastly, the location of the integrated circuit die on the substrate with respect to the Z-axis is ideally within a range of plus or minus twenty five microns (25 µm) to plus or minus fifty microns (50 µm) of the intended Z position.

In addition, the angular alignment of an integrated circuit die on a substrate must be accurate. Assume that the correct angular placement of an integrated circuit die is with a first side parallel to the X-axis and with a second side parallel to the Y-axis. If the integrated circuit die is not correctly aligned in its angular position, then it will be in a rotated position with respect to its correct angular position.

Similarly, it is possible for an integrated circuit die to be angularly misaligned with respect to the vertical Z-axis. Assume that the correct angular placement of an integrated circuit die is for the bottom of the integrated circuit die to be parallel with the surface of the substrate. Then the plane of the bottom of the integrated circuit die is to be perpendicular to the Z-axis. If the bottom of the integrated circuit die is inclined or tilted with respect to the surface of the substrate, then the integrated circuit die will not be in its correct angular position with respect to the vertical Z-axis.

In some types of silicon sensor applications part of the silicon surface of the integrated circuit die is exposed and is not covered by a protective molding. In some types of silicon sensor applications the position of the integrated circuit die must be precisely located with respect to the X, Y, and Z axes in order to have an acceptable yield after the molding process has been performed. That is, in order to improve the yield in silicon sensor applications the tolerance of the location of the integrated circuit die on the substrate must be minimized. This requires minimizing the variations in the X, Y and Z locations of the integrated circuit die, minimizing the angular rotation of the integrated circuit die in the X-Y plane, and minimizing the angular tilt of the integrated circuit die with respect to the Z-axis.

Therefore, it is often necessary that the height of the surface of an integrated circuit die above a substrate be closely controlled, and that the surface of the integrated circuit die be located in a plane that is parallel to the surface of the substrate. The term "planar" is used to refer to the surface of the integrated circuit die when the surface of the integrated die is located in a plane that is parallel to the surface of the substrate.

As previously mentioned, there are some types of manufacturing applications during which the surface of the integrated circuit die must be clamped in order to create a molded integrated circuit package that has some portion of the integrated circuit die surface area free of molding compound. The requirement for controlling the height and planarity of the surface of an integrated circuit die is particularly critical in these types of applications.

FIG. 1 illustrates a cross sectional view of a prior art molding machine 100 showing a clamping mechanism 110 of the molding machine 100 clamped against an integrated circuit die 120. The integrated circuit die 120 is attached to a laminate substrate 125 with a layer of die attach adhesive material 130. An electrical lead 135 connects integrated circuit die 120 to a metal layer (not shown) on laminate substrate 125.

Clamping mechanism 110 comprises a spring 140 that engages a clamp 145. Clamp 145 comprises clamp extension 150 that seats against integrated circuit die 120 due to the force exerted by spring 140. Molding compound is injected through the ports in molding machine 100 to fill cavity 155 and cavity 160 within molding machine 100. When the molding compound is injected the seal provided by clamp extension 150 prevents any molding compound from entering cavity 165 above integrated circuit die 120.

FIG. 2 illustrates a cross sectional view of the molding machine 100 shown in FIG. 1 in which the molding machine 100 has been removed from the molded integrated circuit package. The exposed surface of integrated circuit die 120 is denoted with reference numeral 200.

Various types of clamping mechanisms have been designed to be used with this type of prior art molding process. For example, U.S. Pat. No. 5,800,841 and U.S. Pat. No. 5,987,338 provide a clamping mechanism to exclude molding compound from at least a portion of an area of the surface of an integrated circuit die. Various types of clamping techniques have been employed to cushion the contact forces between the clamp and the surface of the integrated circuit die. However, in order to work properly these clamping techniques normally require that the surface of the integrated circuit die be located within the molding machine within a narrow vertical range.

Some of the prior art techniques develop the proper clamping forces by using a spring arrangement within the clamping mechanism. A spring arrangement requires precise deflections to produce the proper clamping forces. As described below, in order for the spring deflections (and thus the quality of the clamping) to be closely controlled, the vertical position of the top surface of the integrated circuit die must be accurately located within the molding machine.

In other types of clamping techniques, no springs are used and the clamping mechanism is therefore unyielding. This type of clamping technique depends on other elements within the package subassembly to act as surrogate springs for compliance. The surrogate spring elements allow the vertical position and orientation of the integrated circuit die to be adjusted to match the position and orientation of the clamping mechanism.

For example, one prior art technique employs cutouts under the mold to allow limited flexure of the substrate to accommodate some error in the die height or some error in the die planarity. This technique has a number of problems, including complex and synergistic problems with the design of the cutouts in the substrate support, the design of the substrate, and the die attach placement tolerances. Another problem with this technique is that high local contact forces on the die are needed to overcome the flexural stiffness of the laminate substrate in order to rotate and deflect the die so that the die is positioned against and conforms to the rigid clamping surface of the mold.

In another prior art technique a compliant material is added to the top of the integrated circuit die as a thin bead around the clamp contact area to provide accommodation of the misalignment between the integrated circuit die and the clamp.

These prior art techniques usually require more control of the die height and of the die planarity since the surrogate compliant components provide even less vertical accommodation than mechanical springs.

FIG. 3 illustrates a cross sectional view of a clamping mechanism 110 of a molding machine (not shown in FIG. 3) clamped against a non-planar integrated circuit die 320 that is tilted with respect to substrate 125. Die 320 is attached to substrate 125 with die attach adhesive material 130. There are significant adverse consequences that may be caused by improper die height. There are also significant adverse consequences that may be caused by lack of die surface planarity.

First, excessive die height may cause excessive clamping forces to occur. In all designs where clamping against the surface of the die is used, die heights that are larger than the design heights will result in excessive compressive or crushing forces acting on the surface of the die. When the forces become sufficiently high, these forces will damage the brittle integrated circuit base material or will damage the delicate electronic circuitry embedded in the top layers of the die.

Second, non-planarity of the integrated circuit die may cause excessive clamping forces to occur. That is, excessive local clamping forces can be generated when the die surface is not planar. In this case the clamping force is not uniformly distributed. The clamping force is concentrated at the highest contact area 330 between the clamp extension 150 and the top surface of die 320.

Third, insufficient die height may cause a poor clamp seal. Alternatively, when the die surface is too low, the clamping mechanism cannot develop sufficient pressure to seal the critical area against intrusion of molding compound.

Fourth, non-planarity of the integrated circuit die may cause a poor clamp seal. Improper sealing by the clamping mechanism will also occur if the planarity of the die surface is poor. In this case the clamping force is not uniformly distributed and some areas of the clamp will not provide enough clamping pressure to seal the critical area against intrusion of the liquid molding compound under high pressure.

Therefore, it is evident that it is highly desirable to be able to provide a high degree of control of the die height and of the die planarity for an integrated circuit die within a molding machine.

In a standard prior art die attach process, the die attach adhesive is dispensed as a paste or as a liquid. The die attach machine picks a die from a staging area and places the die into the soft die attach material. The die height and die planarity at the conclusion of this process are determined by a number of variables related to the die attach paste. These variables include the volume of the dispensed die attach paste, the pattern of the dispensed die attach paste, and the rheological properties of the dispensed die attach paste. Numerous mechanical factors related to the die attach machine are also important. These factors include the stability and uniformity of the grip of the machine on the die (usually by vacuum), the location of the grip of the machine relative to the central moment of inertia of the die, and the insertion parameters, such as insertion speed and targeted depth of insertion. These factors influence the final position and orientation of the die.

The die height and die planarity are also influenced by distortions imposed on the assembly after the mechanical steps of die placement and insertion. Distortions can also arise from the curing of the polymer adhesive. Distortions can also arise as the composite structure (which includes the cured die attach material) cools down from elevated temperatures.

In one prior art approach to help control the die height and die planarity, particles are added to the die attach adhesive material. The particles are intended to act as spacers or stops against which the die is forced. The particles in the die attach adhesive material are used to control the final bond line thickness and uniformity in the die attach adhesive material. This, in turn, ultimately assists in controlling the die height and die planarity.

Control of the final die height and die planarity through the use of die attach adhesive material loaded with spacer-particles depends on the equipment and techniques employed during the die attach process. The spacer-particle method does not address the problem of movement of the die in the soft material after the force from the insertion tool is removed (e.g., asymmetric forces from surface tension of the paste, buoyant and hydrostatic forces from the paste). The spacer-particle method also does address the problem of distortions (bowing and warpage) that are due to curing and cooling of the various materials that comprise the assembly. These movements and distortions influence the final die height and final die planarity.

In addition, the particle size and particle distribution within the die attach adhesive material must be carefully controlled. This adds expense and complexity to the manufacture, storage and use of the die attach adhesive material.

There is therefore a need in the art for an improved system and method for controlling the die height and the die planarity of an integrated circuit die. There is also a need in the art for an integrated circuit chip having an integrated circuit die with a precisely controlled die height and die planarity.

SUMMARY OF THE INVENTION

To address the deficiencies of the prior art, it is a primary object of the present invention to provide an improved system and method for controlling the die height and the die planarity of an integrated circuit chip.

In one advantageous embodiment of the present invention, a plurality of patterned metal stops are fabricated on an integrated circuit substrate and covered with die attach material. An integrated circuit die is inserted into the die attach material and placed into a clamping mechanism of a molding machine. The clamping mechanism compresses the die into the die attach material. The movement of the die under the pressure of the clamping mechanism rotates the die into parallel alignment with a plane of the integrated circuit substrate. The clamping mechanism of the molding machine pushes the die into contact with the patterned metal stops on the integrated circuit substrate. When the die is in contact with the patterned metal stops, the height of the die can be precisely determined.

It is an object of the present invention to provide an improved system and method for fabricating an integrated circuit.

It is also an object of the present invention to provide an improved system and method for precisely controlling the die height and the die planarity of an integrated circuit die.

It is another object of the present invention to provide an improved system and method for providing a plurality of patterned metal stops on an integrated circuit substrate for precisely determining the die height of an integrated circuit die.

It is yet another object of the present invention to provide an improved system and method for providing a plurality of patterned solder mask stops on an integrated circuit substrate for precisely determining the die height an integrated circuit die.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the Detailed Description of the Invention below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior uses, as well as to future uses, of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which:

FIG. 14 illustrates a flow chart of an exemplary first embodiment of a method of the present invention; and FIG. 15 illustrates a flow chart of an exemplary second embodiment of a method of the present invention.

DETAILED DESCRIPTION OF THE INVENTION

FIGS. 1 through 15, discussed below, and the various embodiments used to describe the principles of the present invention in this patent document are by way of illustration only and should not be construed in any way to limit the scope of the invention. Those skilled in the art will understand that the principles of the present invention may be implemented for any suitably arranged integrated circuit die.

The system and method of the present invention provides a high degree of control of the die height and of the die planarity for an integrated circuit die within a molding machine.

The system and method of the present invention exploits forces that are exerted on the integrated circuit die by the clamping mechanism of the molding machine. The system and method of the present invention also employs die attach material that is compliant (i.e., soft and fluid) at the temperatures and pressures of the molding conditions. The system and method of the present invention also employs features that are patterned in the solder mask and metal layers of the laminate substrate of the die.

As will be more fully described, the system and method of the present invention rotationally adjusts the die so that the top surface of the die becomes aligned with the surface of the clamping mechanism. This controls the die planarity for the die in the molding machine. As will also be more fully described, the system and method of the present invention repositions the die vertically to a precise and repeatable location within the molding system by pushing the die into the soft die attach material and forcing it against patterned metal stops in the laminate substrate. This controls the die height for the die in the molding machine.

Figure 1:
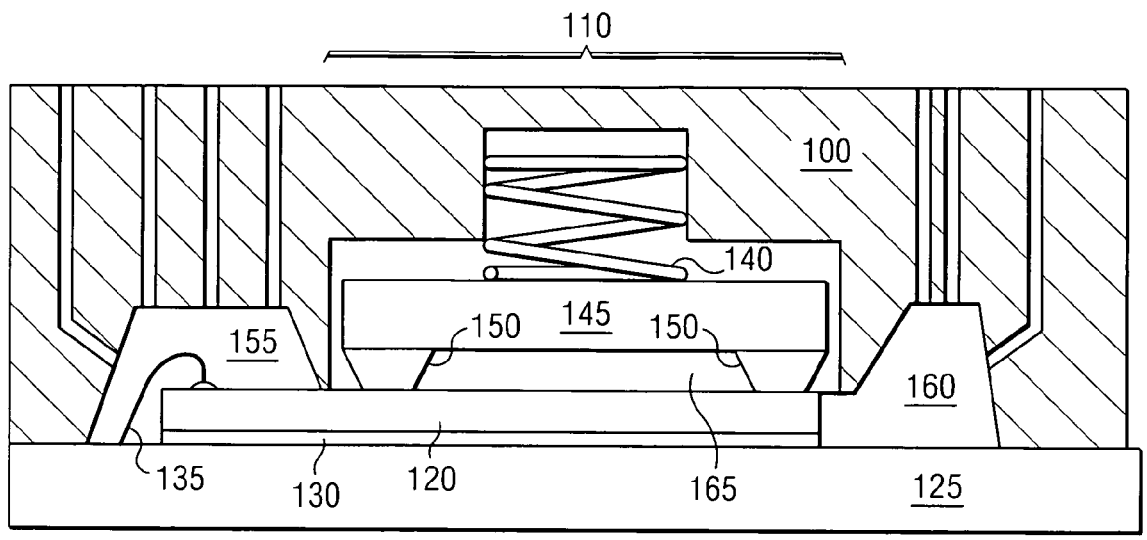
FIG. 1 illustrates a cross sectional view of a prior art molding machine showing a clamping mechanism of the molding machine clamped against an integrated circuit die.
Figure 2:
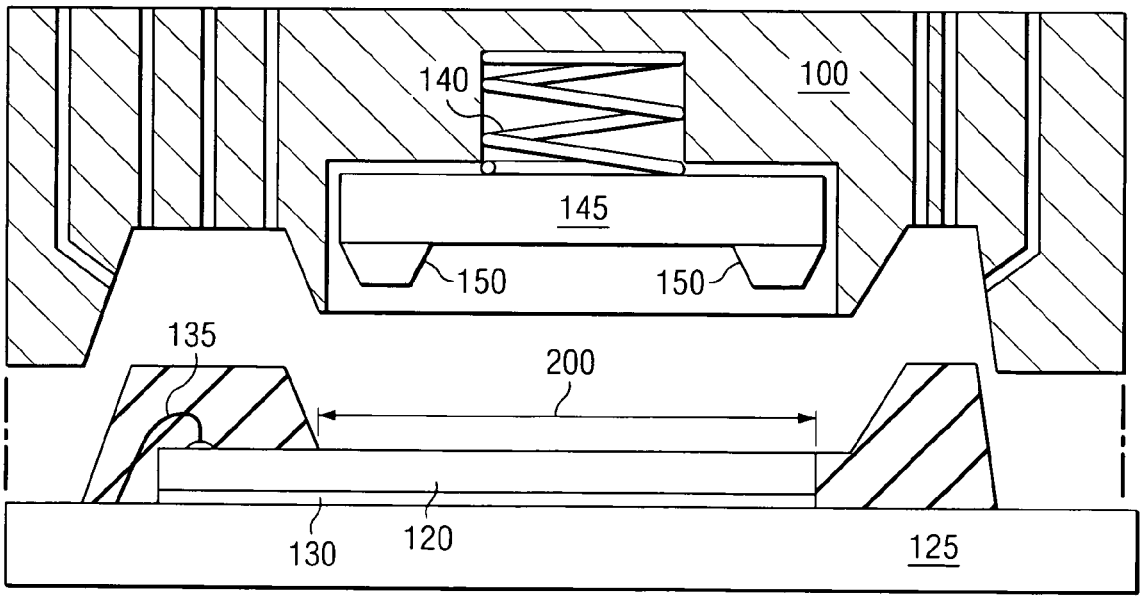
FIG. 2 illustrates a cross sectional view of the prior art molding machine shown in FIG. 1 and a cross sectional view of a molded package integrated circuit having an integrated circuit die with an exposed die surface.
Figure 3:
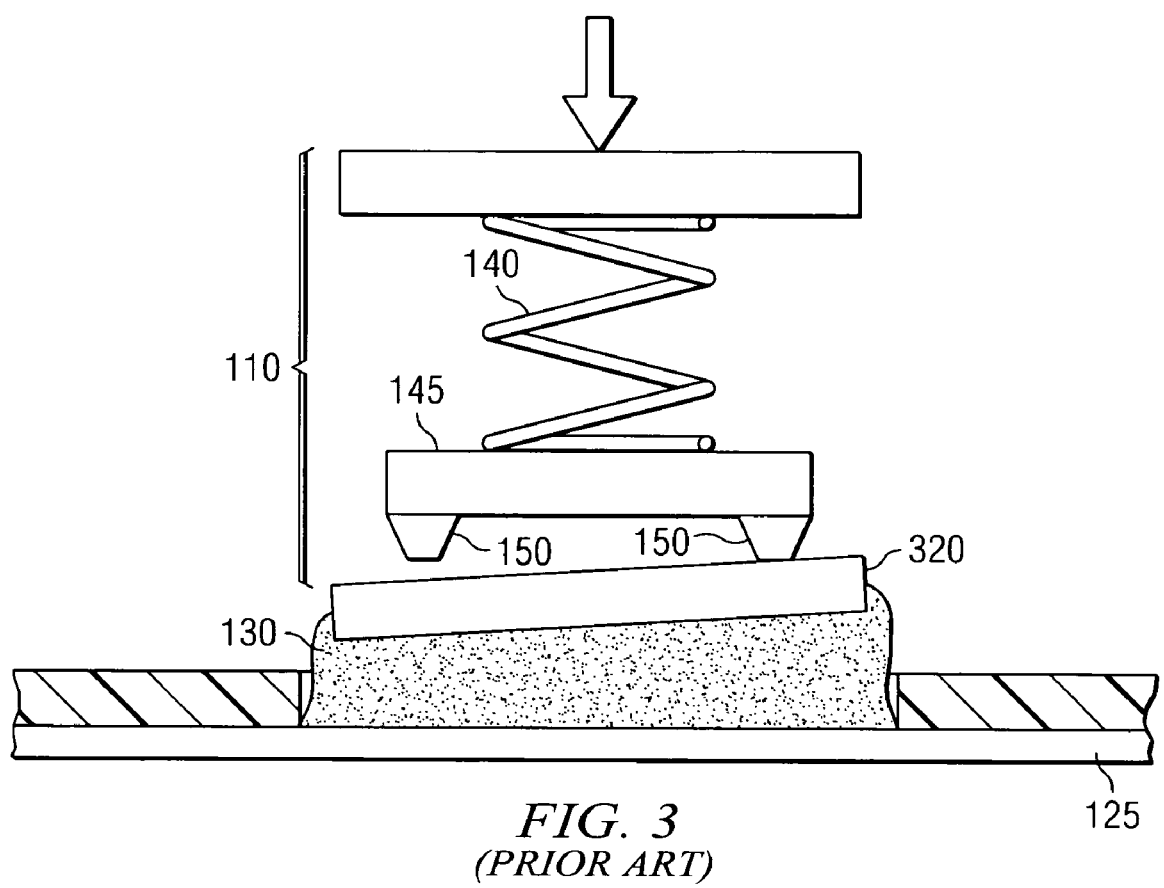
FIG. 3 illustrates a cross sectional view of a clamping mechanism of a prior art molding machine clamped against a non-planar integrated circuit die that is tilted with respect to a substrate.
Figure 4A:
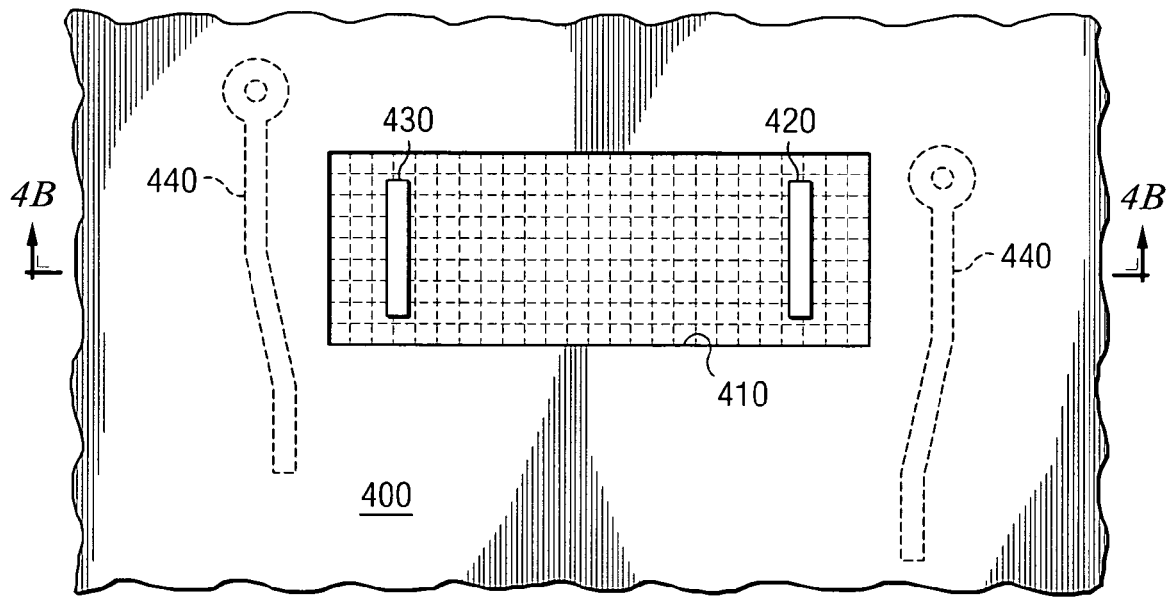
FIG. 4A illustrates a top view of an exemplary solder mask having a solder mask opening and two exposed patterned metal stops for contacting an integrated circuit die in accordance with the principles of the present invention.

First, the patterned metal stops in the laminate substrate will be described. FIG. 4A illustrates a top view of an exemplary solder mask 400 having a solder mask opening 410 and two exposed patterned metal stops, 420 and 430, for contacting an integrated circuit die in accordance with the principles of the present invention. Two exemplary metal traces 440 are shown buried within solder mask 400. The system and method of the present invention will cause an integrated circuit die (not shown in FIG. 4A) to be placed within the solder mask opening 410 and forced into contact with the patterned metal stops, 420 and 430.

Figure 4B:
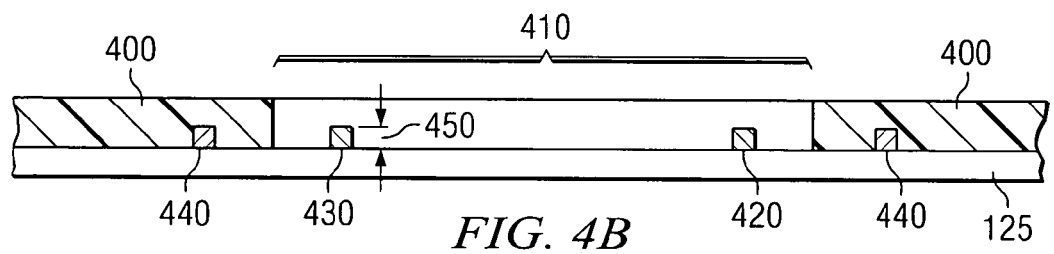
FIG. 4B illustrates a cross sectional side view of the solder mask shown in FIG. 4A taken along line 4B-4B showing the location of the solder mask having a solder mask opening and two exposed patterned metal stops on a substrate in accordance with the principles of the present invention.

FIG. 4B illustrates a cross sectional side view of the solder mask 400 shown in FIG. 4A taken along the line 4B-4B showing the location of the solder mask 400 and solder mask opening 410 and two exposed patterned metal stops on laminate substrate 125. The two exemplary metal traces 440 are shown buried within solder mask 400. The two patterned metal stops, 420 and 430, rest on the surface of laminate substrate 125 within solder mask opening 410. The distance denoted with reference numeral 450 represents the height of the patterned metal stops (the "metal height"). When an integrated circuit die (not shown in FIG. 4A or 4B) is placed within the solder mask opening 410 and forced into contact with the patterned metal stops, 420 and 430, the bottom surface of the die will be located at the "metal height" distance from substrate 125.

Figure 5A:
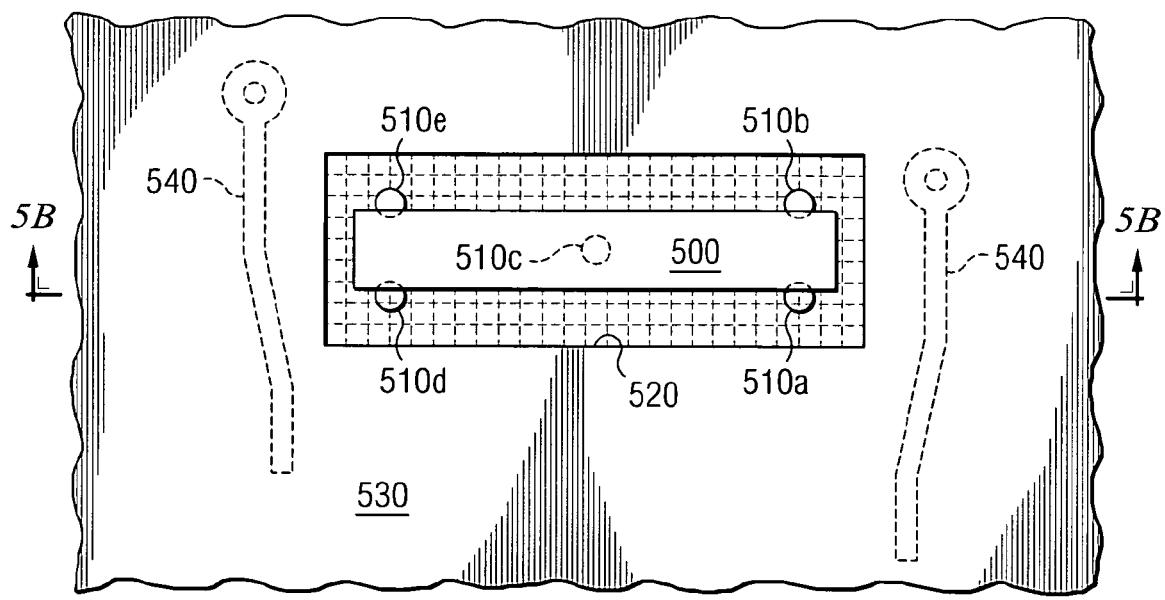
FIG. 5A illustrates a top view of an integrated circuit die resting on a plurality of exposed patterned metal stops located on a substrate within a solder mask opening of a solder mask in accordance with the principles of the present invention.

FIG. 5A illustrates a top view of an integrated circuit die 500 resting on a plurality of exposed patterned metal stops (510a, 510b, 510c, 510d, 510e) that are located on a laminate substrate 125 within a solder mask opening 520 of a solder mask 530 in accordance with the principles of the present invention. In this embodiment the patterned metal stops comprise five cylindrically shaped metal stops that provide support for die 500. Two exemplary metal traces 540 are shown buried within solder mask 530. The system and method of the present invention will cause integrated circuit die 500 to be placed within the solder mask opening 520 and forced into contact with the patterned metal stops (510a, 510b, 510c, 510d, 510e).

Figure 5B:
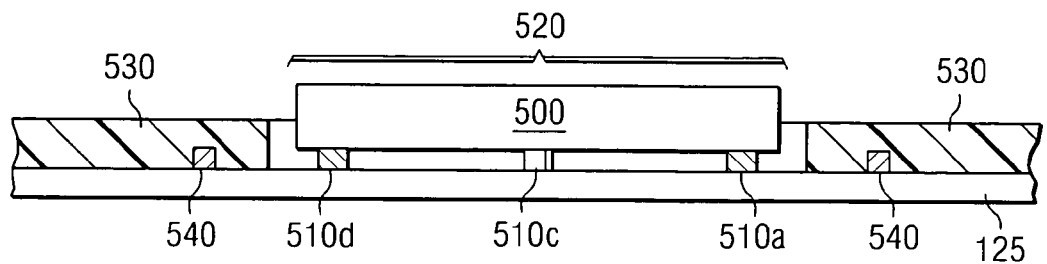
FIG. 5B illustrates a cross sectional side view of the integrated circuit die and solder mask shown in FIG. 5A taken along line 5B-5B showing the integrated circuit die resting on a plurality of exposed patterned metal stops located on the substrate within the solder mask opening of the solder mask in accordance with the principles of the present invention.

FIG. 5B illustrates a cross sectional side view of the integrated circuit die 500 and the solder mask 530 shown in FIG. 5A taken along the line 5B-5B showing the integrated circuit die 500 resting on the plurality of the patterned metal stops (510a, 510b, 510c, 510d, 510e) that are located on the laminate substrate 125 within the solder mask opening 520. The two exemplary metal traces 540 are shown buried within solder mask 530. The five cylindrically shaped patterned metal stops (510a, 510b, 510c, 510d, 510e) rest on the surface of laminate substrate 125 within solder mask opening 520. As in the case of the embodiment shown in FIG. 4B, the height of the patterned metal stops is referred to as the "metal height." When integrated circuit die 500 is placed within the solder mask opening 520 and forced into contact with the five patterned metal stops (510a, 510b, 510c, 510d, 510e), the bottom surface of integrated circuit die 500 is located at the "metal height" distance from substrate 125.

In another embodiment of the present invention, the patterned metal stops may be covered with portions of the solder mask. The patterned solder mask stops contact and support the integrated circuit die in the same manner as the patterned metal stops.

Figure 6A:
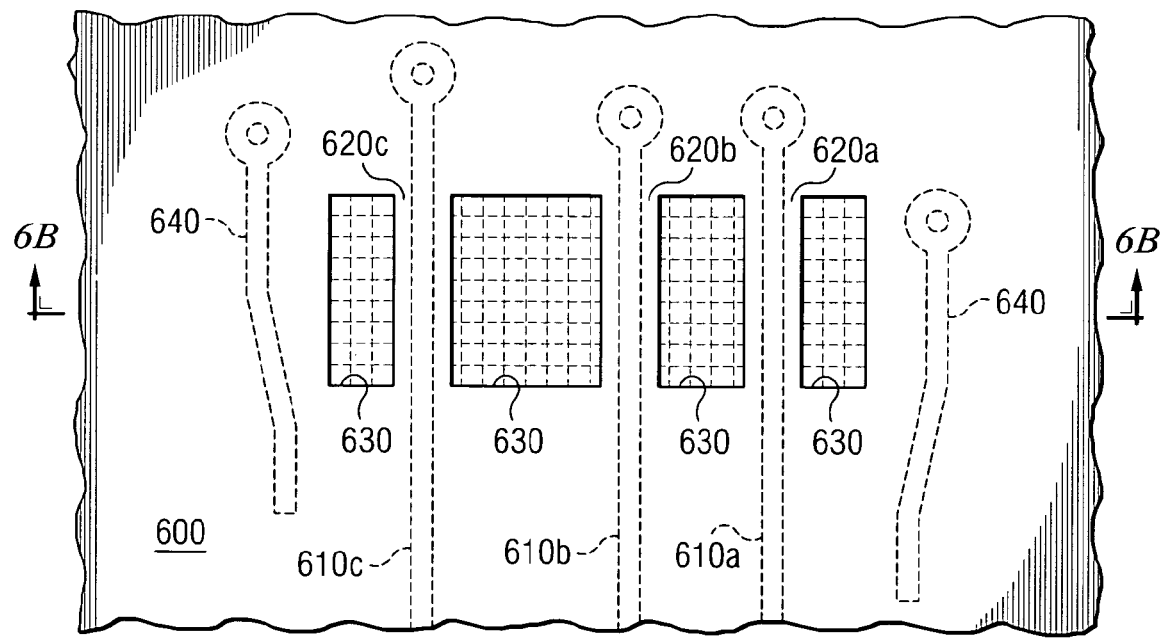
FIG. 6A illustrates a top view of an exemplary patterned solder mask comprising a plurality of metal traces in the die attach area of the solder mask that serve as patterned metal stops for contacting an integrated circuit die in accordance with the principles of the present invention.

For example, FIG. 6A illustrates a top view of an exemplary patterned solder mask 600 comprising a plurality of metal traces (610a, 610b, 610c) in the die attach area of the solder mask 600 that serve as patterned metal stops for contacting an integrated circuit die (not shown in FIG. 6A) in accordance with the principles of the present invention.

In this embodiment the patterned metal stops comprise three metal traces (610a, 610b, 610c) that are respectively covered by three portions of solder mask (620a, 620b, 620c) placed over solder mask opening 630. Two additional exemplary metal traces 640 are shown buried within solder mask 600. The system and method of the present invention will cause an integrated circuit die to be placed within the solder mask opening 630 and forced into contact with the patterned solder mask stops (620a, 620b, 620c) that are placed over the patterned metal traces (610a, 610b, 610c).

Figure 6B:
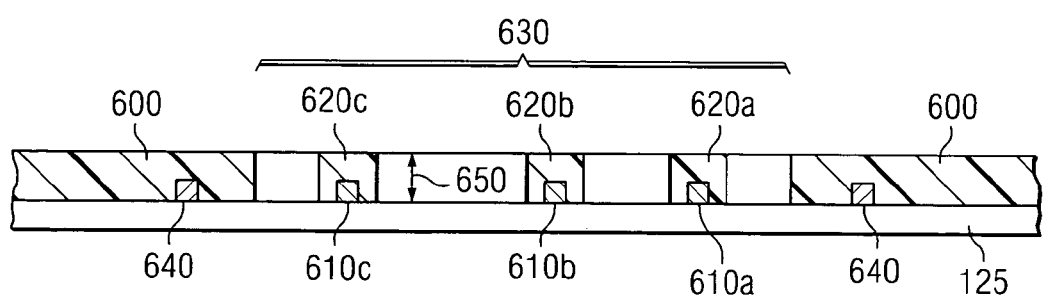
FIG. 6B illustrates a cross sectional side view of the patterned solder mask shown in FIG. 6A taken along line 6B-6B showing the location of patterned solder mask stops on a substrate in accordance with the principles of the present invention.

FIG. 6B illustrates a cross sectional side view of the patterned solder mask 600 shown in FIG. 6A taken along the line 6B-6B showing the location of the three patterned solder mask stops (620a, 620b, 620c) on laminate substrate 125. The two additional exemplary metal traces 640 are shown buried within solder mask 600. The three patterned solder mask stops (620a, 620b, 620c) rest on the surface of laminate substrate 125 within solder mask opening 630. The distance denoted with reference numeral 650 represents the height of the patterned solder mask stops (the "solder mask height"). When an integrated circuit die (not shown in FIG. 6A or 6B) is placed within the solder mask opening 630 and forced into contact with the patterned solder mask stops (620a, 620b, 620c) the bottom surface of the die will be located at the "solder mask height" distance from substrate 125.

After laminate substrate 125 has been provided with patterned metal stops (or patterned solder mask stops), then the following steps are performed. The patterned metal stops (or patterned solder mask stops) within the solder mask opening are covered with die attach material. An integrated circuit die is inserted into the die attach material. The integrated circuit die (and attached substrate) is placed in a molding machine and is clamped with a clamping mechanism. When the clamping mechanism makes initial contact with the integrated circuit die, the surface of the integrated circuit die may be non-planar. That is, the surface of the integrated circuit die may or may not be in a plane that is parallel to the plane of the laminate substrate.

Figure 7A:
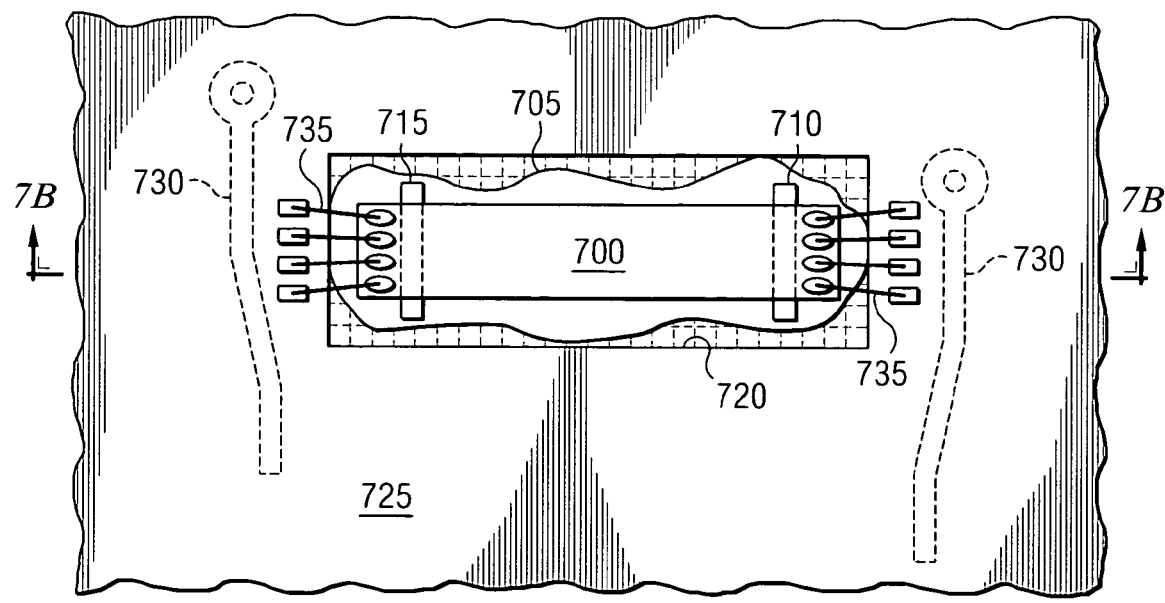
FIG. 7A illustrates a top view of a non-planar integrated circuit die that is attached to a substrate with die attach adhesive in accordance with the principles of the present invention.
Figure 7B:
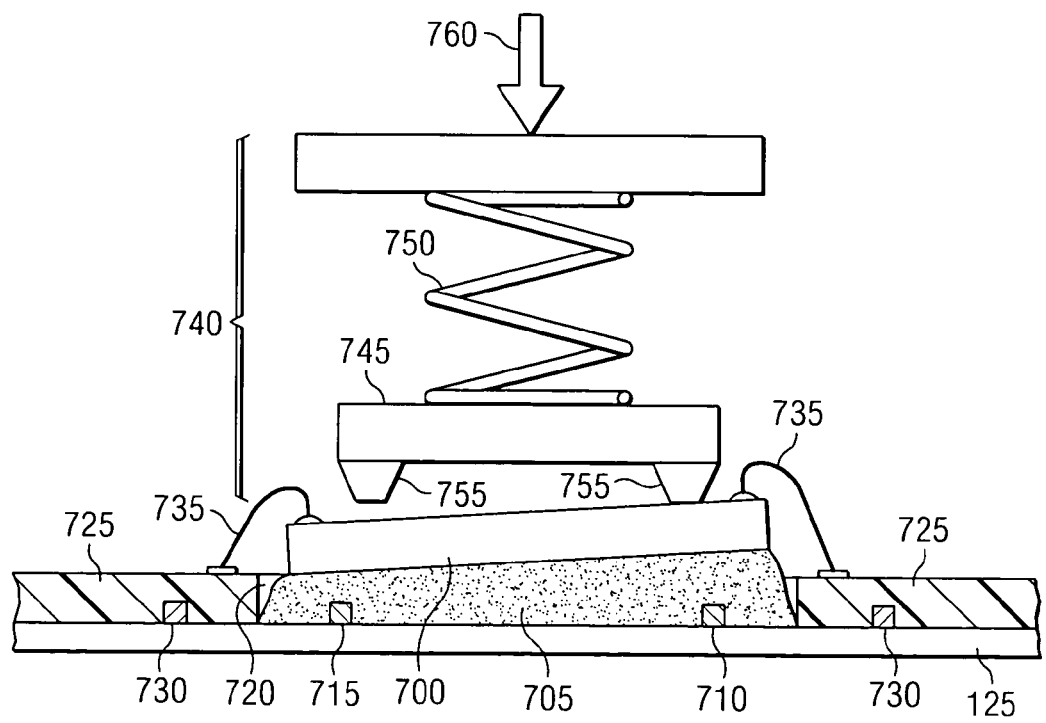
FIG. 7B illustrates a cross sectional side view of the non-planar integrated circuit die shown in FIG. 7A taken along line 7B-7B showing an exemplary initial contact of the integrated circuit die with a clamping mechanism of a molding machine in accordance with the principles of the present invention.

FIGS. 7A and 7B illustrate the possible orientation of an integrated circuit die 700 with respect to laminate substrate 125 as clamp 745 of a clamping mechanism 740 initially engages the top surface of integrated circuit die 700. FIG. 7A illustrates a top view of non-planar integrated circuit die 700 attached to die attach material 705 that covers two patterned metal stops (710 and 715) that are located on a laminate substrate 125 within a solder mask opening 720 of a solder mask 725 in accordance with the principles of the present invention. Two exemplary metal traces 730 are shown buried within solder mask 725. Integrated circuit die 700 is wirebonded to solder mask 725 with wire bonds 735. As will be more fully described, the system and method of the present invention will cause integrated circuit die 700 to be forced into contact with the patterned metal stops (710 and 715).

FIG. 7B illustrates a cross sectional side view of the integrated circuit die 700 and solder mask 725 shown in FIG. 7A taken along the line 7B-7B showing the integrated circuit die 700 attached to die attach material 705 that covers two patterned metal stops (710 and 715) that are located on a laminate substrate 125 within the solder mask opening 720. The two exemplary metal traces 730 are shown buried within solder mask 725. The two patterned metal stops (710 and 715) rest on the surface of laminate substrate 125 within solder mask opening 720.

FIG. 7B also illustrates a cross sectional side view of a clamping mechanism 740 of a molding machine (not shown in FIG. 7B). Clamping mechanism 740 comprises clamp 745 and spring 750. Clamp 745 comprises clamp extension 755 that seats against integrated circuit die 700 due to the force exerted by spring 750. The arrow 760 represents the magnitude of force exerted by clamping mechanism 740. As clamping mechanism 740 increases the clamping force on integrated circuit die 700, the body of integrated circuit die 700 rotates into alignment with the engaged surface of clamp extension 745. As integrated circuit die 700 moves and rotates due to the clamping force, the die attach material 705 under integrated circuit die 700 compresses and/or extrudes from under integrated circuit die 700 to accommodate the motion of integrated circuit die 700.

Figure 8A:
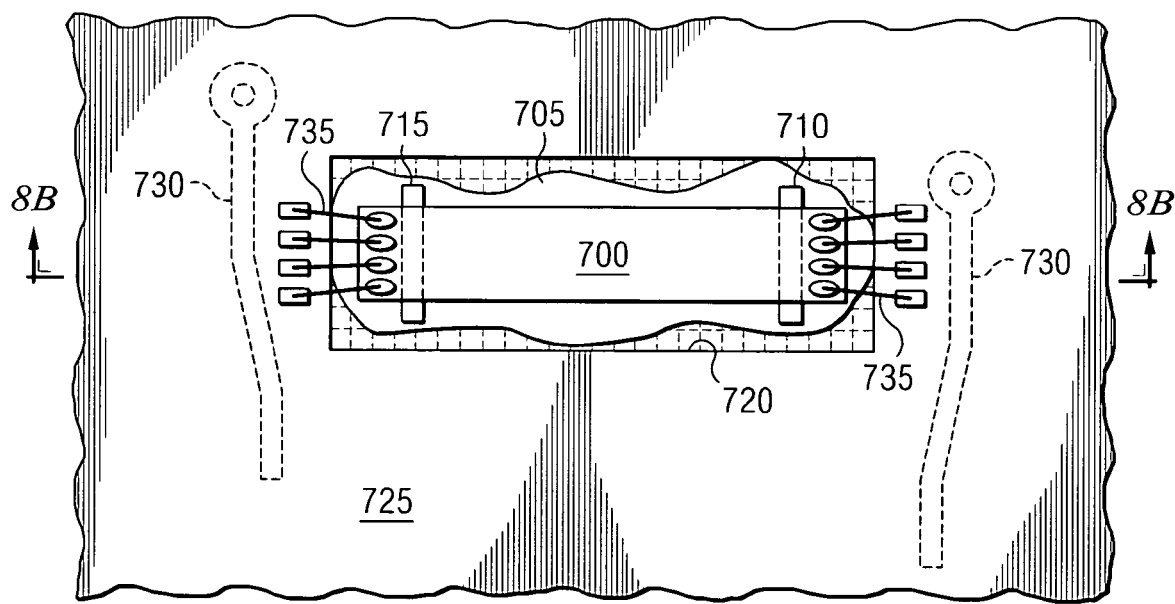
FIG. 8A illustrates a top view of an integrated circuit die that is attached to a substrate with partially compressed die attach adhesive after a clamping mechanism of a molding machine has aligned the integrated circuit die by rotation in accordance with the principles of the present invention.
Figure 8B:
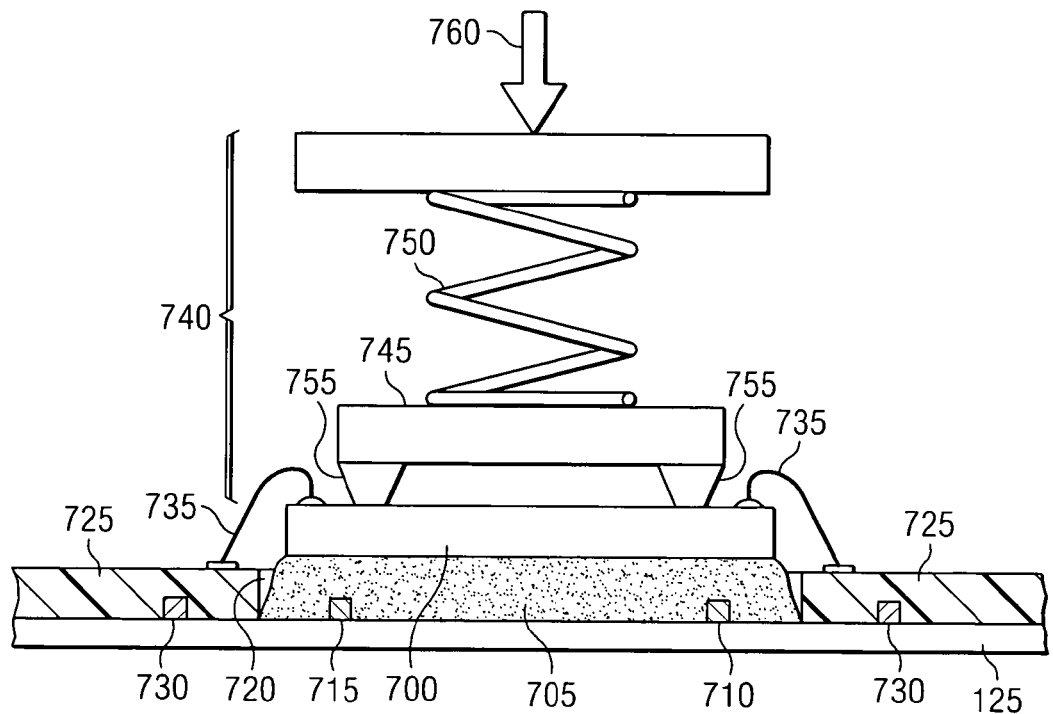
FIG. 8B illustrates a cross sectional side view of the integrated circuit die shown in FIG. 8A taken along line 8B-8B showing the engagement of the clamping mechanism with the integrated circuit die and the location of the integrated circuit die with respect to the partially compressed die attach adhesive in accordance with the principles of the present invention.

An intermediate step of the compression process is shown in FIGS. 8A and 8B. FIGS. 8A and 8B illustrate the position of integrated circuit die 700 previously shown in FIGS. 7A and 7B with respect to laminate substrate 125 after clamp 745 has rotated integrated circuit die 700 into alignment with the engaged surface of clamp extension 745. As shown in FIG. 8B, die attach material 705 is partially compressed. The top surface (and the bottom surface) of integrated circuit die 700 is now planar with respect to laminate substrate 125 (and clamp 745). At this stage of the compression process, arrow 760 represents a light force exerted by clamping mechanism 740. This is because clamping mechanism 740 is pushing integrated circuit die 700 through the soft die attach material 705. In the intermediate step of the compression process shown in FIGS. 8A and 8B, the bottom surface of integrated circuit die 700 has not yet reached the level of the patterned metal stops, 710 and 715.

Figure 9A:
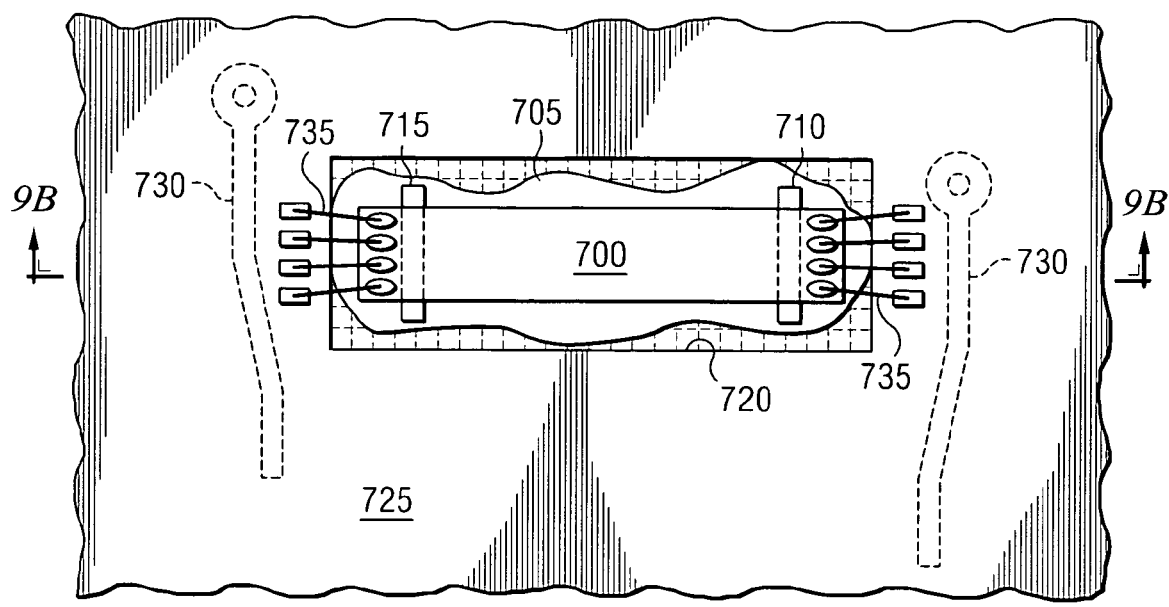
FIG. 9A illustrates a top view of an integrated circuit die that is attached to a substrate with fully compressed die attach adhesive after a clamping mechanism of a molding machine has forced the integrated circuit die against patterned metal stops on a substrate in accordance with the principles of the present invention.
Figure 9B:
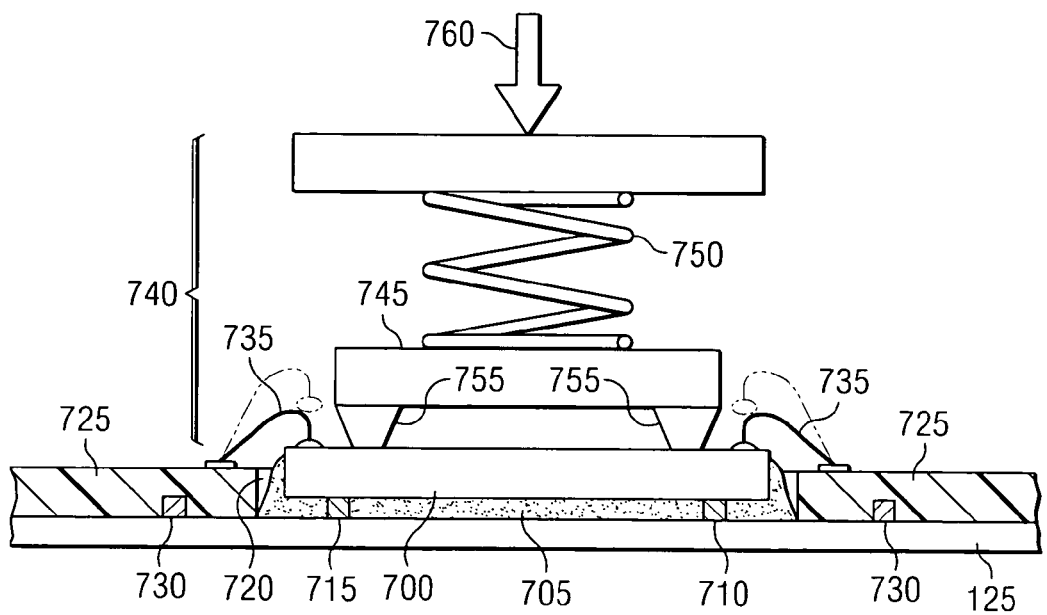
FIG. 9B illustrates a cross sectional side view of the integrated circuit die shown in FIG. 9A taken along line 9B-9B showing the engagement of the clamping mechanism with the integrated circuit die and the location of the integrated circuit die with respect to the patterned metal stops and the fully compressed die attach adhesive in accordance with the principles of the present invention.

A final step of the compression process is shown in FIGS. 9A and 9B. FIGS. 9A and 9B illustrate the position of integrated circuit die 700 previously shown in FIGS. 8A and 8B with respect to laminate substrate 125 after clamp 745 has pushed integrated circuit die 700 into engagement with the patterned metal stops, 710 and 715. As shown in FIGS. 9A and 9B, die attach material 705 is compressed and extruded from under integrated circuit die 700. The bottom surface of integrated circuit die 700 is now in direct contact with the patterned metal stops, 710 and 715. At this stage of the compression process, arrow 760 represents a large clamp sealing force exerted by clamping mechanism 740. This is because clamping mechanism 740 is pushing integrated circuit die 700 directly against the firm metal surfaces of the patterned metal stops, 710 and 715. In the final step of the compression process shown in FIGS. 9A and 9B, the height of the top surface of integrated circuit die 700 (the "die height") is precisely known because the value of the "metal height" is precisely known. In this manner, the die height and die planarity of integrated circuit die 700 may be precisely controlled during an integrated circuit molding process.

The rotational realignment of the surface of integrated circuit die 700 to that of the surface of clamp extension 755 establishes uniform clamping around the periphery of die 700. Uniform contact around the periphery of clamp extension 755 is required for good sealing and minimizes the forces exerted on die 700 by clamp 745.

As a result of the precautions and design criteria normally required for successful molding, the location of the laminate substrate 125 within the molding machine is carefully controlled. In addition, the normal manufacturing tolerances for the laminate substrate 125 are tightly controlled. Therefore, after the laminate substrate 125 has been positioned within the mold, any patterned features (e.g., patterned metal stops) on the surface of the laminate substrate 125 are very accurately located with respect to the molding machine. Because the patterned metal stops, 710 and 715, are precisely located within the molding machine, the die 700 comes to rest at a precise location when die 700 is forced against the patterned metal stops.

In the first embodiment of the present invention described above, a normal die attach process is used and no extraordinary care is needed to control either the die height tolerance or the die height planarity. To facilitate the realignment of the die, however, it is preferred (but not required) for the thickness of the die attach material 705 to be slightly thicker than normal.

The die height and the die planarity of die 700 are readjusted from the values of the die height and die planarity that are established when die 700 is attached to die attach material 705. The new desired values of die height and die planarity are achieved during the molding operation using the "downward" motion of die 700 by the forces produced by the clamping mechanism 740 of the molding machine (not shown).

In order to allow the die 700 to move under the forces from the clamping mechanism 740 of the molding machine the die attach material 705 is selected so that it is "soft" or fluid at the molding temperature. This allows the die 700 to rotate within the die attach material 705 so that the top surface of die 700 re-aligns to become coincident with the contact surface of clamp extension 755. Compare the relative positions of die 700 and clamp extension 755 in FIG. 7B with the relative positions of die 700 and clamp extension 755 in FIG. 8B.

As the downward motion of clamp 745 continues, the die 700 is inserted deeper into the soft die attach material 705 until the bottom surface of die 700 is forced against the patterned metal stops, 710 and 715, that are located on the laminate substrate 125. Compare the relative positions of die 700 and the patterned metal stops, 710 and 715, in FIG. 8B with the relative positions of die 700 and the patterned metal stops, 710 and 715, in FIG. 9B.

During the realignment process and the insertion process described above, the soft or liquid die attach material 705 produces minimal resistance to the "downward" movement of clamp 745. However, when the bottom surface of die 700 contacts the patterned metal stops, 710 and 715, the vertical downward travel of die 700 ceases and the clamping force on the surface of die 700 increases to the desired level needed during the molding operation to seal the periphery of the clamp extension 755.

Because die 700 is now held fixed against the patterned metal stops, 710 and 715, the height of die 700 above the laminate substrate 125 and the planarity of die 700 are precisely controlled. Consequently, because the laminate substrate 125 is precisely positioned vertically within the molding machine, the die 700 is positioned precisely vertically within the molding machine with the top surface of die 700 coincident with the surface of the clamp extension 755 of clamp 745.

The clamping mechanism 740 continues to hold the die 700 against the patterned metal stops, 710 and 715, as the molding compound is injected into the molding machine and while the molding compound hardens. When the clamp 745 is withdrawn the solidified mold compound secures the die 700 in place while the molded part is cooled. Eventually the die attach material 705 becomes more viscous and hardens as the part continues to cool and lower temperatures are reached.

It will be noted that as the die 700 rotates to realign with the surface of the clamp extension 755 and as the die 700 is inserted into the soft die attach material 705, the bond wires 735 will flex and rotate to accommodate displacement and reorientation of the die 700. This feature is illustrated in FIG. 9B. Because the movements that are associated with the reorientation and displacement of die 700 are small, the flexural strains imposed upon the bonding wires 735 are small and can be accommodated by the ductile metals that are used for wirebonding (e.g., gold).

Depending on the mechanical and rheological properties of the die attach material 705, the soft die attach material 705 under the die 700 will be compressed or extruded. As well as functioning as terminators for the vertical displacement of die 700, the solder mask 725 and the patterned metal stops, 710 and 715 can define openings that accommodate the excess die attach material 705 that is displaced from under the die 700. The ability to divert the excess die attach material 705 helps prevent hydrostatic resistance to the insertion of the die 700 and helps prevent hydrostatic rebound forces from developing when the clamping force is removed from the die 700.

The properties of die attach material 705 are key to the die realignment and insertion process. The die attach material 705 must be soft enough at the molding temperatures (approximately 180° C.) to allow the die 700 to both rotate and to displace the softened die attach material 705 while the die 700 is being pushed toward the patterned metal stops, 710 and 715. However, the die attach material 705 must be sufficiently firm at the wirebonding step that precedes the molding operation to achieve proper wirebonding.

A number of polymer materials are available that have the above described properties. QM1 3040 LM is one such material. QM1 3040 LM is a thermoplastic-based re-workable die attach material that softens at elevated temperatures. QM1 3040 LM is a semi-solid or highly viscous material at wirebonding temperatures, but it softens above 150° C.

It is also possible that the die attach material 705 be compliant throughout a range that encompasses both the wirebonding temperatures and the molding temperatures. The elastic and plastic properties of the die attach material 705 must provide a balance between the firmness that is required to achieve good wirebonding and the compliance and deformability that is required during the molding operation that allows the die 700 to realign within the die attach material 705 during the realignment phase and to sufficiently displace the die attach material 705 in order for the die 700 to contact the patterned metal stops, 710 and 715. Silicones are a family of polymer adhesives that fit these requirements.

Metals and metal alloys provide another family of die attach material 705 that have the proper melting or softening properties. For example, eutectic or near eutectic Tin-Lead solder alloys melt or soften at 183° C.

Because metals or metal alloys do not react with the polymer materials used in the construction of laminate printed circuit boards (e.g., solder mask, prepreg layers, or glass fibers) no adhesive bond can develop between these materials to secure the die 700 to the laminate substrate 125. This limits the bonding of metallic die attach materials to the metal elements exposed on the surface of the laminate substrate 125. Therefore, if metals or metal alloys are to be used as die attach materials, they must be reactive with both the integrated circuit base material, such as silicon, and the metal trace material used to form the patterned metal stops, 710 and 715.

To promote this type of bonding it can be helpful to apply special coatings to the bottom of the silicon chip. Sputtered or evaporated solderable metals such as gold are typically applied to the back of the wafer during fabrication of the wafer. The pattern for the patterned metal stops, 710 and 715, can also be tailored to optimize the soldering process that joins the die 700 to the metal traces. The extensive experience and technology developed by the electronics industry for designing solder pads can be applied to shaping and locating the metal traces used for the patterned metal stops so that they concurrently serve as solder pads for joining the die 700 to the laminate substrate 125 using the solder as the binding material.

The patterned features created within the solder mask 735 and metal layers, 710 and 715, on the laminate substrate 125 are tightly controlled during the normal manufacturing processes for printed circuit boards. The normal manufacturing pattern geometries and tolerances for these materials have values that are compatible with the desired final positional tolerances of the die 700 within the molding machine.

The thickness values (i.e., vertical distances) and tolerances of the materials that are used to define the supports can be selected from normal production values to provide a final thickness that is within the preferred bond line thickness range of one (1) to three (3) mils. This bond line thickness range is equivalent to twenty-five (25) microns to seventy-five (75) microns.

In the embodiment of the invention shown in FIG. 9B, the metal trace thickness (i.e., the "metal height") controls the die height relative to the laminate substrate 125 and therefore the final bond line thickness. Metal thickness values of one and one half (1.5) mils (equivalent to thirty eight (38) microns) can easily be produced by conventional laminate substrate manufacturing operations. The variations in thickness of the metal traces can be held to less than ten (10) microns.

Solder mask thickness can also be closely controlled in the normal manufacturing processes for the laminate substrate 125. The tolerances for the solder mask thickness are normally less than ten (10) microns and can be held very closely over the metal trace areas. In addition, several layers of solder mask can be applied to provide thick areas of solder mask.

It should be noted that there is also another possibility for constructing stops with a patterned solder mask. In this alternate embodiment there are no metal portions located under (i.e., within) the solder mask stops. The patterned solder mask is itself sufficient to act as a stop. There must be no metal traces covered with solder mask located in the die attach area. Otherwise the metal traces covered with solder mask would be taller than the stand alone solder mask stops.

A second embodiment of the present invention will now be described. The second embodiment is similar to the first embodiment in that features patterned in the surface layers of the laminate substrate 125 are used as stops or spacers against which the die 700 is forced. The die 700 is positioned at an accurate and reproducible height above the laminate substrate 125 and the die 700 is planarized with respect to the plane of the laminate substrate 125.

However, in the second embodiment, the die placement equipment is used in the die attach process, and not in a mold clamping process in a molding machine. The die placement equipment forces the die 700 through the die attach material 705 and against the patterned metal stops (or patterned solder mask stops). Performing the full die insertion during the die attach process allows the use of a broader range of die attach materials.

Figure 10A:
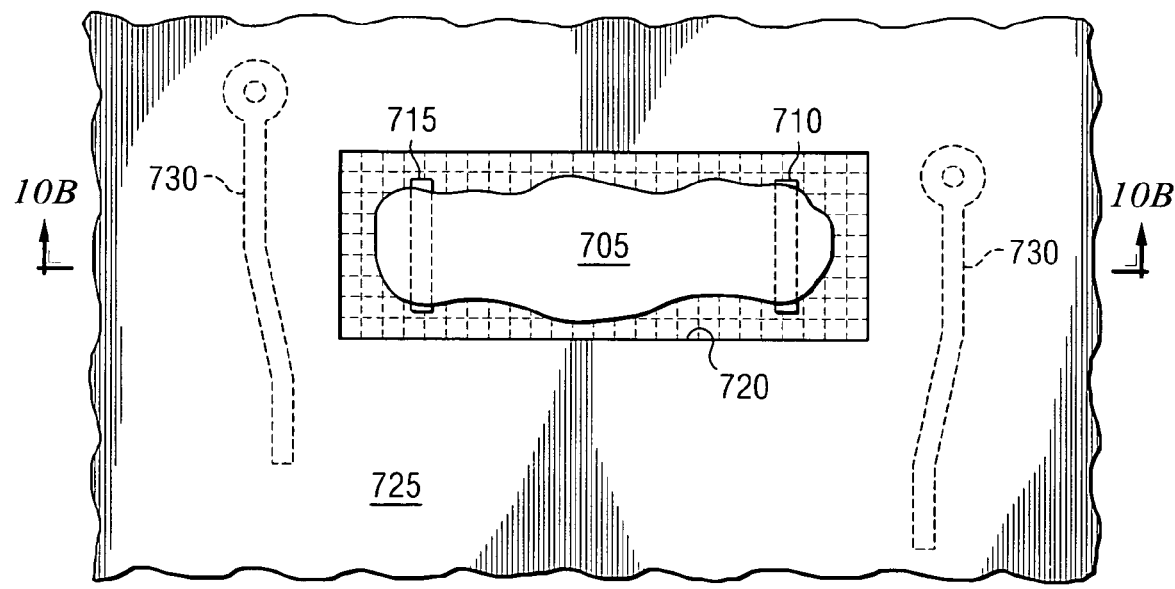
FIG. 10A illustrates a top view of a die attach adhesive that is attached to a substrate and that covers two exemplary patterned metal stops on the substrate prior to the insertion of an integrated circuit die in accordance with the principles of the present invention.

FIG. 10A illustrates a top view of an exemplary solder mask 725 having a solder mask opening 720 and two exposed patterned metal stops, 710 and 715, for contacting an integrated circuit die in accordance with the principles of the second embodiment of the invention. Two exemplary metal traces 730 are shown buried within solder mask 725. The system and method of the present invention will cause integrated circuit die 700 (shown in FIG. 10BA) to be placed within the solder mask opening 720 and forced into contact with the patterned metal stops, 710 and 715.

Figure 10B:
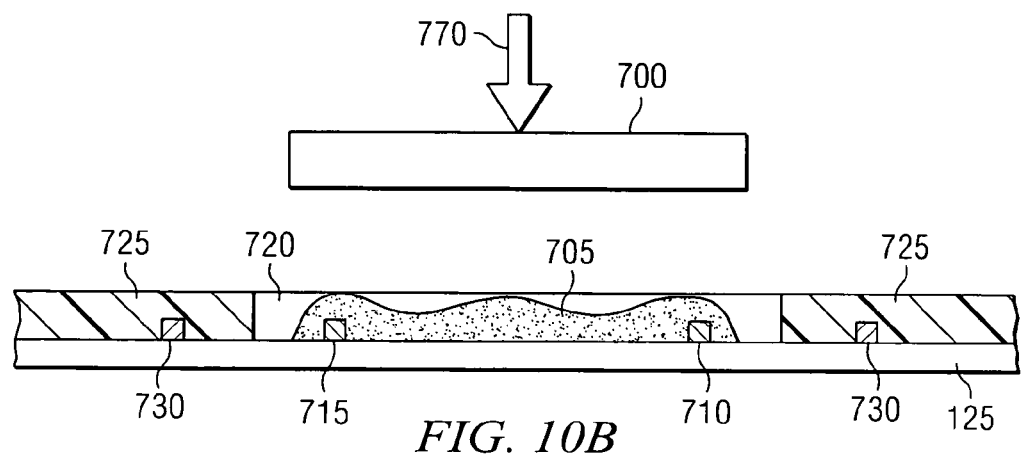
FIG. 10B illustrates a cross sectional side view of the die attach adhesive shown in FIG. 10A taken along line 10B-10B showing the location of the die attach adhesive and the two exemplary patterned metal stops on the substrate in accordance with the principles of the present invention.

FIG. 10B illustrates a cross sectional side view of the solder mask 725 shown in FIG. 10A taken along the line 10B-10B showing the location of the solder mask 725 and two patterned metal stops, 710 and 715, on laminate substrate 125. The two exemplary metal traces 730 are shown buried within solder mask 725. The two patterned metal stops, 710 and 715, on the surface of laminate substrate 125 are covered with die attach material 705.

Figure 11A:
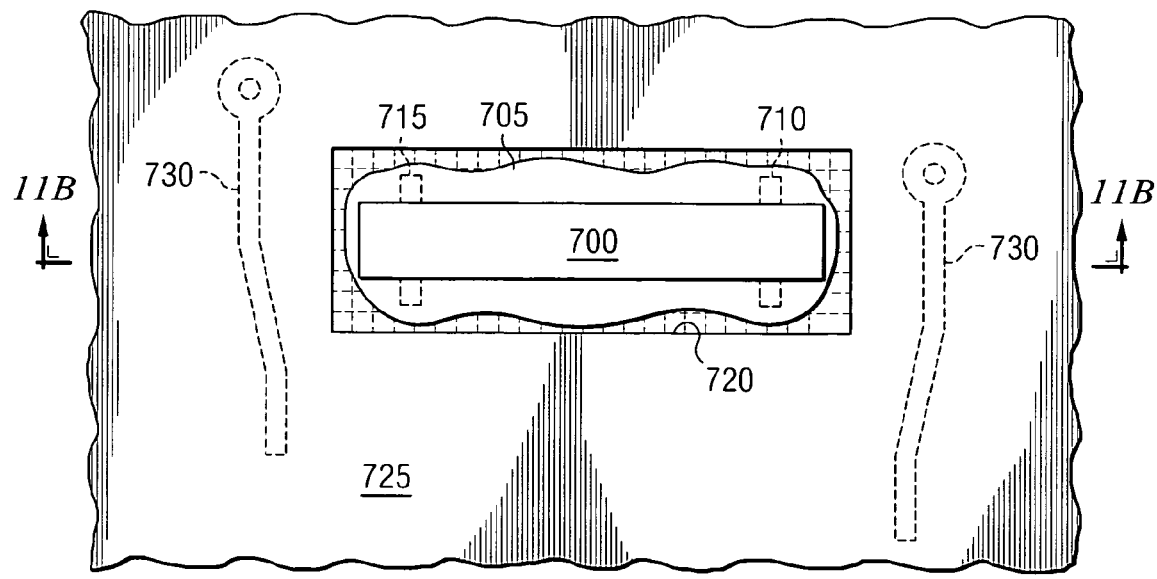
FIG. 11A illustrates a top view of an integrated circuit die that is attached to a substrate with fully compressed die attach adhesive after a clamping mechanism of a molding machine has forced the integrated circuit die against patterned metal stops on a substrate in accordance with the principles of the present invention.
Figure 11B:
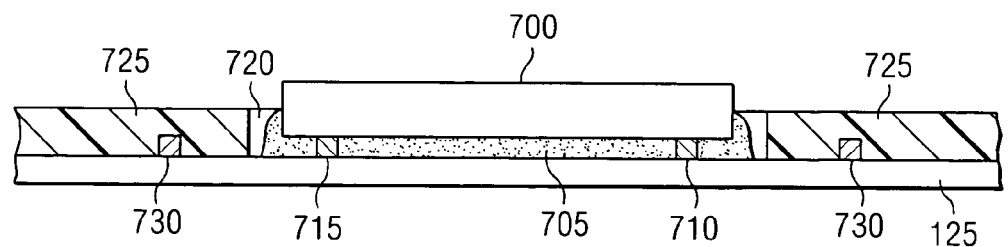
FIG. 11B illustrates a cross sectional side view of the integrated circuit die shown in FIG. 11A taken along line 11B-11B showing the location of the integrated circuit die with respect to the patterned metal stops and the fully compressed die attach adhesive in accordance with the principles of the present invention.

The arrow 770 in FIG. 10B represents a magnitude of force exerted on die 700 by the die placement equipment (not shown) during the die attach process. The die placement equipment forces the die 700 downward through the die attach material 705 and into contact with the patterned metal stops, 710 and 715, on the laminate substrate 125. The resulting placement of the die 700 is shown in FIG. 11A and in FIG. 11B. FIG. 11B is a cross sectional side view of die 700 attached by the die attach material 705 to laminate substrate 125 shown in FIG. 11A taken along the line 11B-11B.

Figure 12A:
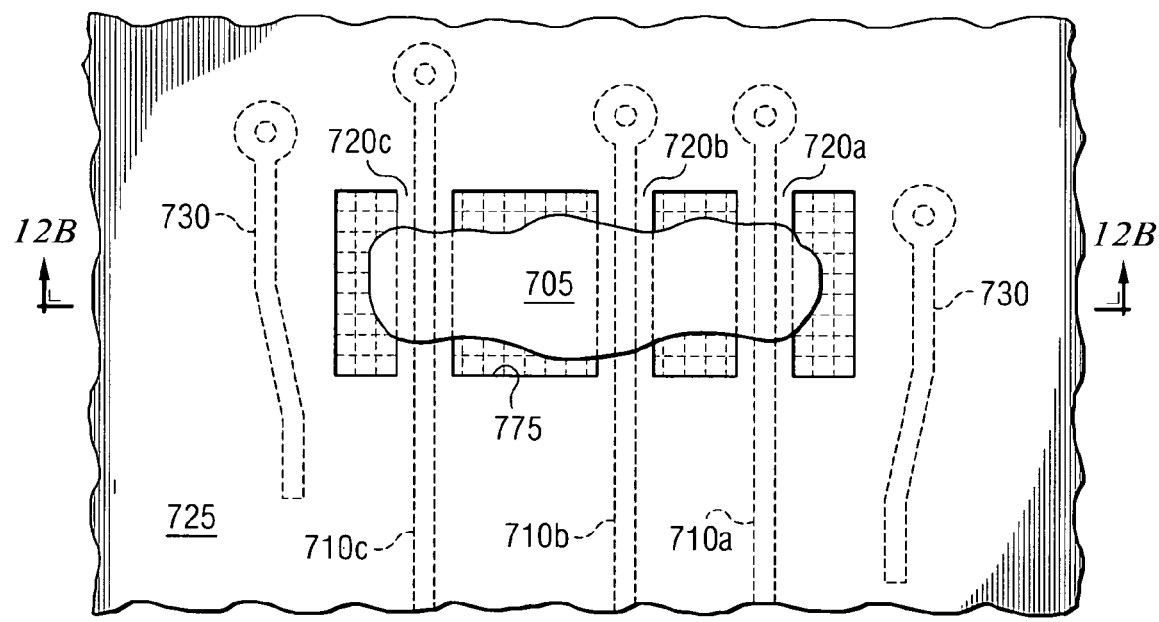
FIG. 12A illustrates a top view of a die attach adhesive that is attached to a substrate and that covers a patterned solder mask that covers a plurality of exemplary patterned metal stops on the substrate prior to the insertion of an integrated circuit die in accordance with the principles of the present invention.

FIG. 12A illustrates a top view of an exemplary patterned solder mask 725 comprising a plurality of metal traces (710*a*, 710*b*, 710*c*) in the die attach area of the solder mask 725 that serve as patterned metal stops for contacting integrated circuit die 700 (shown in FIG. 12B) in accordance with the principles of the second embodiment of the invention.

In this embodiment the patterned metal stops comprise three metal traces (710*a*, 710*b*, 710*c*) that are respectively covered by three portions of solder mask (720*a*, 720*b*, 720*c*) placed over solder mask opening 775. Two additional exemplary metal traces 730 are shown buried within solder mask 725. The integrated circuit die 700 is placed on the die attach material 705 within the solder mask opening 775. The die placement equipment (not shown) forces the die 700 into contact with the patterned solder mask stops (720*a*, 720*b*, 720*c*) that are placed over the patterned metal traces (710*a*, 710*b*, 710*c*).

Figure 12B:
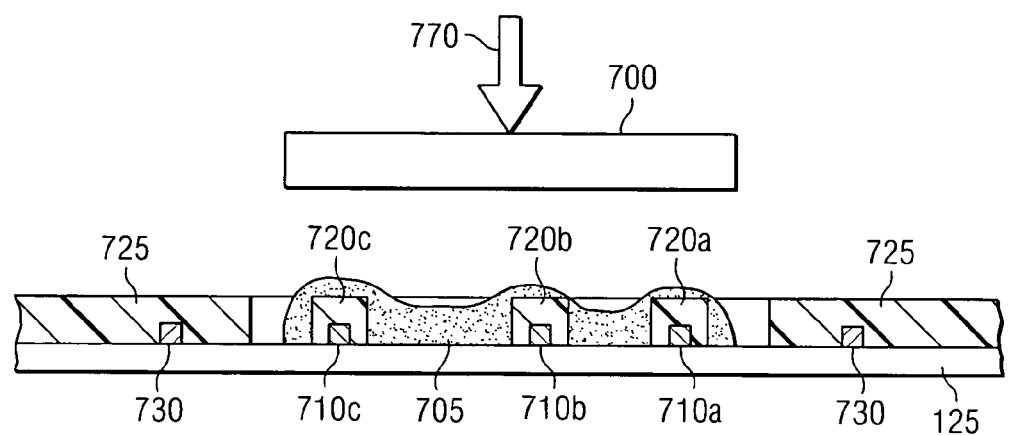
FIG. 12B illustrates a cross sectional side view of the die attach adhesive shown in FIG. 12A taken along line 12B-12B showing the location of the die attach adhesive that covers the patterned solder mask and the plurality of exemplary patterned metal stops on the substrate in accordance with the principles of the present invention.

FIG. 12B illustrates a cross sectional side view of the patterned solder mask 725 shown in FIG. 12A taken along the line 12B-12B showing the location of the three patterned solder mask stops (720*a*, 720*b*, 720*c*) on laminate substrate 125. The two additional exemplary metal traces 730 are shown buried within solder mask 725. The three patterned solder mask stops (720a, 720b, 720c) rest on the surface of laminate substrate 125 within solder mask opening 775. The three patterned solder mask stops, (720a, 720b, 720c) on the surface of laminate substrate 125 are covered with die attach material 705.

Figure 13A:
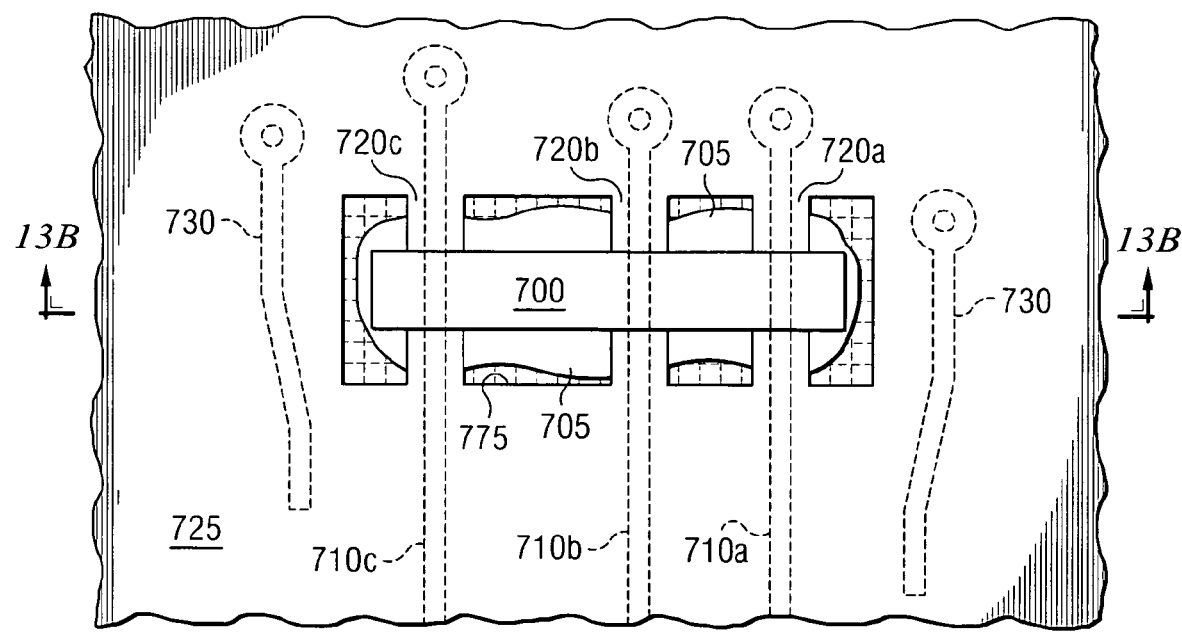
FIG. 13A illustrates a top view of an integrated circuit die that is attached to a substrate by fully compressed die attach adhesive that covers a patterned solder mask that covers a plurality of exemplary patterned metal stops on the substrate after a clamping mechanism of a molding machine has forced the integrated circuit die against the patterned solder mask that covers the plurality of patterned metal stops on the substrate in accordance with the principles of the present invention.
Figure 13B:
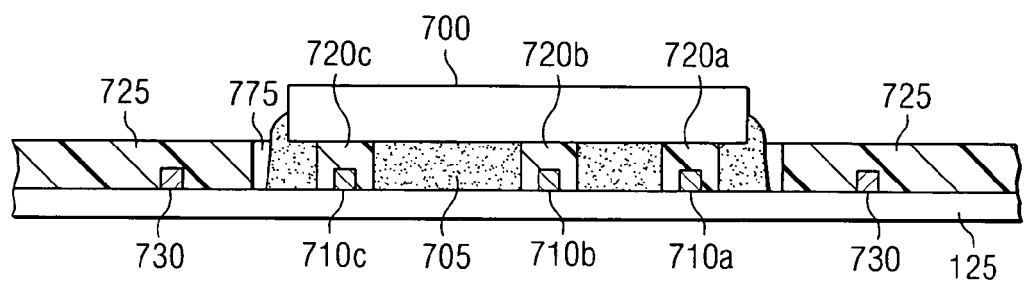
FIG. 13B illustrates a cross sectional side view of the integrated circuit die shown in FIG. 13A taken along line 13B-13B showing the location of the integrated circuit die with respect to the patterned solder mask and the patterned metal stops and the fully compressed die attach adhesive in accordance with the principles of the present invention.

The arrow 770 in FIG. 12B represents a magnitude of force exerted on die 700 by the die placement equipment (not shown) during the die attach process. The die placement equipment forces the die 700 downward through the die attach material 705 and into contact with the patterned metal stops, (720a, 720b, 720c), on the laminate substrate 125. The resulting placement of the die 700 is shown in FIG. 13A and in FIG. 13B. FIG. 13B is a cross sectional side view of die 700 attached by the die attach material 705 to laminate substrate 125 shown in FIG. 13A taken along the line 13B-13B.

Inserting the die 700 against the stops (either patterned metal stops or patterned solder mask stops) during the die attach step provides several advantages. The first advantage is that conventional prior art die attach materials (typically thermosetting polymers) are normally in the form of a paste or viscous liquid. In these forms the die attach material is soft and pliable at the time of the die insertion step, regardless of the ultimate physical or mechanical properties of the die attach material. Because pastes or liquids offer low resistance to the die insertion and reorientation processes, the insertion tool may use very low magnitude forces on the delicate surface of the die to effect die reorientation and insertion.

Another advantage is that a large spectrum of die attach materials can be supplied in a paste or liquid form. As noted above, in a paste or liquid form the rheological properties of a die attach material are substantially different than the rheological properties of a die attach material in its final state (usually after subsequent thermal treatments). For example, in most die attach materials a thermosetting polymer is used and a subsequent curing step is employed to harden the polymer material. The cured and hardened material rigidly secures the die to the substrate. This condition is highly desirable for proper wirebonding.

Another advantage of inserting the die against the patterned stops during the die attach process is that a larger selection of materials can be used for the insertion tool that is in contact with the die surface. The integrated circuit package molding environment (previously described with reference to the first embodiment of the invention) imposes restrictions on the materials that can be used in the construction of the tool used to contact the die 700 (e.g., clamp 745 in clamping mechanism 740). In a molding environment the tool is exposed to high temperatures (e.g., 180° C.), high pressures, and, in some cases, abrasive media. Further, the clamping mechanism 740 must be very robust since its replacement is usually a difficult and expensive process.

On the other hand, the die attach environment is relatively benign. The die attach process is usually performed at room temperatures and pressures (i.e., relatively low temperatures and pressures). In addition, replacement of a die attach tool is usually simple and inexpensive. The relaxed requirements imposed on the die attach tool allow a larger selection of materials for that part of the tool that contacts the die. In the die attach environment the materials that contact the die surface can be softer and need not meet the longevity or working life requirements for components used in a molding machine.

In the second embodiment of the invention, accurate die placement vertical height and accurate planarity is achieved through the use of accurately located stops that serve as spacers. In this capacity the patterned stops serve the same function as the spacer-particles that are used in some prior art die attach materials (previously described) to control bond line thickness and die planarity. In the present invention, a major advantage of using patterned stops in the laminate substrate to control bond line thickness and die planarity is that the use of patterned stops eliminates the expense and problems associated with the special formulation, manufacture, storage, and application methods associated with die attach materials that are loaded with spacer-particles.

As noted in the general discussion in the background section regarding conventional die attach processes, there are a number of forces acting on the die during the die attach process. These forces can cause the die to change its position or orientation. As long as the force pushing the die against the patterned stops is maintained, these "secondary" forces are not strong enough to move the die.

However, when the relatively large force pinning the die to the patterned stops is withdrawn, these "secondary" forces may cause the die to move. In such a case the ideal die position and die orientation achieved by seating the die against the patterned stops can be degraded.

As previously described, a variety of "secondary" forces acting on the die potentially exist. Among these secondary forces are: (a) forces from surface tension between the paste or liquid die attach material and the die, (b) buoyancy and hydrostatic rebound forces, and (c) distortions caused by polymer curing and cooling of the die assembly.

Generally these secondary forces can be minimized by judicious selection of the die attach material, selection and control of the pattern and the volume of the dispensed material, and design and control of the thermal processes such as curing.

In view of these factors, the position and orientation of the die may not be perfectly aligned with the laminate substrate following the procedure of the second embodiment of the invention. However, the die position and die orientation obtained by the die attach process of the second embodiment of the invention is substantially better than the die position and die orientation that can be obtained by a normal die attach process.

As previously noted, the die attach material that is usually (but not necessarily) employed in the procedure of the second embodiment of the invention is a thermosetting adhesive material that rigidly secures the die to the laminate substrate following a curing process. Because the die is rigidly secured to the laminate substrate, the die is immobilized. Unlike the die clamping procedure of the first embodiment of the invention, there is very little opportunity for fine adjustments to be made to the die height or to the die orientation during the die attach process.

That is, in the procedure of the second embodiment of the invention, the die height and the die planarity are basically established during the die attach process. Unlike the case in the first embodiment of the invention, the die height and die planarity cannot be generally readjusted to achieve an ideal vertical position within a molding machine and a custom alignment within a clamping mechanism.

The patterns in the solder mask in the second embodiment of the invention can also be used to accommodate excess die attach material that is displaced from under the die during the compression process. This feature eases the penetration of the die into the soft material as the die is forced "downward" against the patterned stops. The ability to accommodate displaced excess material from under the die also helps minimize the buoyant and hydrostatic rebound forces that act as "secondary" forces.

As noted in the description of the first embodiment of the invention, the scale and tolerance of the features patterned in the solder mask and in the metal layers are adequate to create the precision stops and to define reservoirs for the excess displaced die attach material in both the first and second embodiments of the invention.

In some cases it may not be desirable for the die attach tool to insert the die completely against the patterned stops. In such cases, a first tool is used to partially insert the die into the die attach material during the die attach process. Then a second tool is used to force the die completely against the patterned stops on the laminate substrate.

Ideally the second tool would be used while the die attach material was still soft from the dispensing step. However, depending on the properties of the die attach material and depending on its processing history, it may be possible to subsequently soften the die attach material so that the second tool may be used to perform the step of forcing the die completely against the patterned stops on the laminate substrate.

FIG. 14 illustrates a flow chart of an exemplary first embodiment of a method of the present invention. The steps of the method are collectively referred to with reference number 1400.

In the first step of the method a plurality of patterned stops (patterned metal stops or patterned solder mask stops) are fabricated on an integrated circuit substrate (step 1410). The patterned stops are then covered with die attach material (step 1420). An integrated circuit die is then inserted into the die attach material (step 1430). The integrated circuit die is then placed in a clamping mechanism of a molding machine (step 1440). As the clamping mechanism compresses the integrated circuit die, the die is rotated to cause the surface of the die to be parallel with the integrated circuit substrate (step 1450). Also as the clamping mechanism compresses the integrated circuit die, the die is moved into contact with the patterned stops on the integrated circuit substrate (step 1460).

FIG. 15 illustrates a flow chart of an exemplary second embodiment of a method of the present invention. The steps of the method are collectively referred to with reference number 1500.

In the first step of the method a plurality of patterned stops (patterned metal stops or patterned solder mask stops) are fabricated on an integrated circuit substrate (step 1510). The patterned stops are then covered with die attach material (step 1520). An integrated circuit die is then inserted into the die attach material with a die attach tool (step 1530). As the die attach tool moves the integrated circuit die into the die attach material, the die is rotated to cause the surface of the die to be parallel with the integrated circuit substrate (step 1540). Also as the die attach tool moves the integrated circuit die into the die attach material, the die is moved into contact with the patterned stops on the integrated circuit substrate (step 1550).

Although the present invention has been described in detail, those skilled in the art will understand that various changes, substitutions, and alterations herein may be made without departing from the spirit and scope of the invention it its broadest form.

What is claimed is:

1. A method for controlling a height and a planarity of an integrated circuit die in a molding machine, said method comprising the steps of:
    fabricating a plurality of patterned stops on an integrated circuit substrate;
    covering said patterned stops on said integrated circuit substrate with die attach material;
    inserting said integrated circuit die into said die attach material;
    clamping said integrated circuit die within a clamping mechanism of said molding machine; and
    controlling said height and said planarity of said integrated circuit die with said clamping mechanism of said molding machine, wherein controlling the height and the planarity of the integrated circuit die comprises moving the integrated circuit die with the clamping mechanism of the molding machine to cause the integrated circuit die to physically contact the patterned stops on the integrated circuit substrate.

2. The method as claimed in claim 1 wherein the step of controlling said height and said planarity of said integrated circuit die comprises the step of:
    rotating said integrated circuit die with said clamping mechanism of said molding machine to cause said integrated circuit die to be parallel to a plane of said integrated circuit substrate.

3. The method as claimed in claim 1 wherein said patterned stops on said integrated circuit substrate comprise patterned metal stops.

4. The method as claimed in claim 1 wherein said patterned stops on said integrated circuit substrate comprise patterned solder mask stops.

5. The method of claim 1, wherein:
    fabricating the patterned stops comprises fabricating the patterned stops in at least one opening of a solder mask; and
    the solder mask and the patterned stops define one or more openings capable of accommodating excess die attach material that is displaced from under the integrated circuit die.

6. The method of claim 1, further comprising:
    injecting a molding compound into one or more cavities, each of the one or more cavities at least partially defined by a portion of the integrated circuit die and a portion of the integrated circuit substrate.

* * * * *